United States Patent
Michael et al.

(10) Patent No.: US 10,249,346 B2
(45) Date of Patent: Apr. 2, 2019

(54) POWER SUPPLY AND POWER SUPPLYING METHOD THEREOF FOR DATA PROGRAMMING OPERATION

(71) Applicant: Winbond Electronics Corp., Taichung (TW)

(72) Inventors: Oron Michael, San Jose, CA (US); Dae Hyun Kim, San Jose, CA (US)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 15/649,632

(22) Filed: Jul. 13, 2017

(65) Prior Publication Data

US 2019/0019539 A1    Jan. 17, 2019

(51) Int. Cl.
G11C 5/14 (2006.01)
H02M 3/07 (2006.01)

(52) U.S. Cl.
CPC ............... *G11C 5/145* (2013.01); *H02M 3/07* (2013.01)

(58) Field of Classification Search
CPC .................................................. G11C 16/30
USPC .................................................. 365/185.18
See application file for complete search history.

(56) References Cited

U.S. PATENT DOCUMENTS

| 7,176,747 B2 * | 2/2007 | Lee ................ G11C 5/145 327/536 |
| 7,224,207 B2 | 5/2007 | Chou et al. |
| 7,957,204 B1 * | 6/2011 | Wu ................ G11C 5/145 365/185.11 |
| 9,356,506 B1 | 5/2016 | Ho |
| 2007/0019471 A1 * | 1/2007 | Chan ................ G11C 16/16 365/185.18 |
| 2007/0147133 A1 * | 6/2007 | Im ................ G11C 16/10 365/185.28 |
| 2010/0188909 A1 * | 7/2010 | Kenkare ................ G11C 11/419 365/189.16 |
| 2011/0002173 A1 * | 1/2011 | Nagamatsu ........ G11C 16/0483 365/185.18 |
| 2011/0252206 A1 | 10/2011 | Pyeon |
| 2014/0140161 A1 * | 5/2014 | Eguchi ................ G11C 5/145 365/226 |
| 2016/0197550 A1 | 7/2016 | Shao |

FOREIGN PATENT DOCUMENTS

| CN | 101095275 | 12/2007 |
| TW | 201603461 | 1/2016 |
| TW | I572135 | 2/2017 |

OTHER PUBLICATIONS

"Office Action of Taiwan Counterpart Application," dated Jul. 23, 2018, pp. 1-7.

\* cited by examiner

*Primary Examiner* — Min Huang
(74) *Attorney, Agent, or Firm* — JCIPRNET

(57) ABSTRACT

A power supply includes a plurality of charge pump circuits. The charge pump circuits commonly generate an output voltage for programming a write data to the memory apparatus. Wherein, number of the charge pump circuits enabled for generating the output voltage is determined according to number of programmed bit(s) of the write data.

14 Claims, 4 Drawing Sheets

POWER SUPPLY AND POWER SUPPLYING METHOD THEREOF FOR DATA PROGRAMMING OPERATION

BACKGROUND

Field of the Invention

The invention relates to a power supply and power supplying method thereof. Particularly, the invention relates to the power supply for supplying an output voltage for data programming operation according an amount of bits that needs to be programmed.

Description of Related Art

In a non-volatile memory, a charge pump circuit is enabled for providing an output voltage during a data programming operation being operated. In conventional art, the charge pump circuit is fully turned on during the data programming operation being operated regardless how many bits of the memory needed to be programmed. That is, every time the charge pump is enabled it consume maximum amount of current, and results in non-efficient pump power usage.

SUMMARY OF THE INVENTION

The disclosure is directed to a power supply for data programming operation and power supplying method thereof for improving power efficiency.

The disclosure provides the power supply including a plurality of charge pump circuits. The charge pump circuits commonly generate an output voltage for programming a write data to the memory apparatus. Wherein, number of the charge pump circuits enabled for generating the output voltage is determined according to number of programmed bit(s) of the write data.

The disclosure also provides the power supplying method for data programming operation including: providing a plurality of charge pump circuits to commonly generate an output voltage for programming a write data to the memory apparatus; receiving write data with a plurality of bits; and, determining number of the charge pump circuits enabled for generating the output voltage according to number of programmed bit(s) of the write data.

According to the above descriptions, the present disclosure determine number of enabled charge pump circuits according to number of programmed bits of the write data. That is, the number of the enabled charge pump circuits is adjusted dynamically according to the number of the programmed bits, and power consumption efficiency can be improved accordingly.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1:
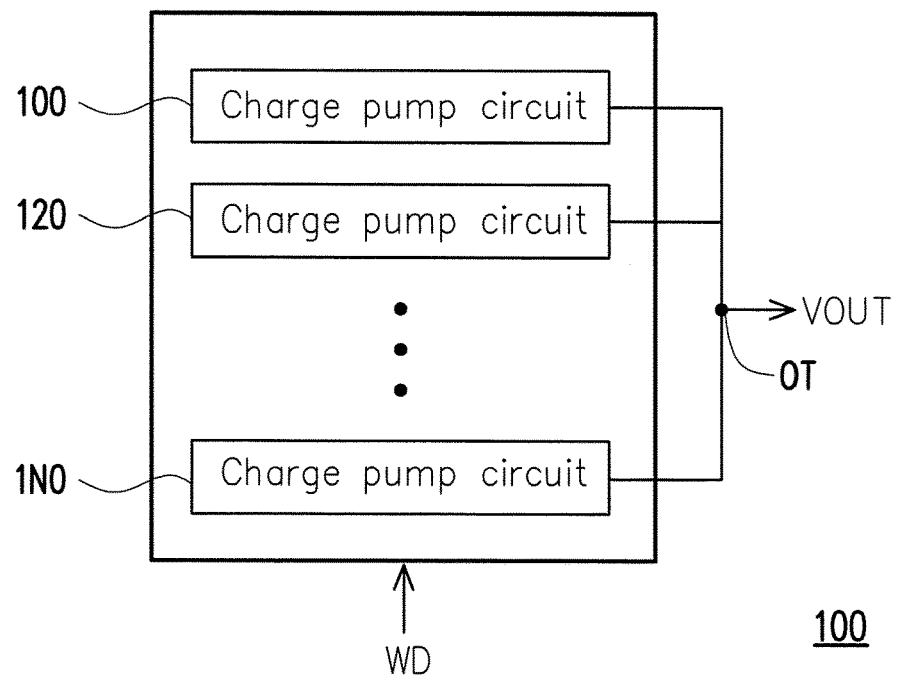
FIG. 1, which illustrates a schematic diagram of a power supply for data programming operation according an embodiment of present disclosure.

Referring to FIG. 1, which illustrates a schematic diagram of a power supply for data programming operation according an embodiment of present disclosure. The power supply 100 includes a plurality of charge pump circuits 110-1N0. Output ends of the charge pump circuits 110-1N0 are commonly coupled to an output end OT of the power supply 100. The charge pump circuits 110-1N0 may receive write data WD with a plurality of bits. When a data programming operation on a memory apparatus is operated, one or more charge pump circuits 110-1N0 may be enabled for generating an output voltage VOUT. The output voltage VOUT is provided to be an operating power of the data programming operation. It should be noted here, number of the charge pump circuits 110-1N0 enabled for generating the output voltage VOUT is determined according to number of programmed bit(s) of the write data WD.

For example, number of the charge pump circuits 110-1N0 may equal to number of bits of the write data WD. The number of enabled charge pump circuits may be equal to the number of the programmed bit(s) of the write data WD. Furthermore, if the write data WD has eight bits, and four of the bits are programmed bits (i.e., logic "0"), four of the charge pump circuits 110-1N0 are enabled for generating the output voltage VOUT.

For another example, the number of the charge pump circuits 110-1N0 may not equal to the number of bits of the write data WD. The number of the charge pump circuits 110-1N0 may equal to four, and the number of bits of the write data WD may equal to eight. In this case, if only one bit or two bits of the write data WD is (are) programmed bit(s), only one of the charge pump circuits 110-1N0 is enabled for generating the output voltage VOUT; if three or four bits of the write data WD are programmed bits, two of the charge pump circuits 110-1N0 are enabled for generating the output voltage VOUT; if five or six bits of the write data WD are programmed bits, three of the charge pump circuits 110-1N0 are enabled for generating the output voltage VOUT; and if seven or eight bits of the write data WD are programmed bits, all of the charge pump circuits 110-1N0 are enabled for generating the output voltage VOUT.

On the other hand, hardware structures of the charge pump circuits 110-1N0 are the same, and voltage levels outputting by the charge pump circuits 110-1N0 are the same during operating.

Whether the bit of the write data WD is the programmed bit or not can be determined by logic level of the bit of the write data WD. If a memory cell of the memory apparatus stores data with logic "1" after performing an erasing operation, the logic level of the bit of the write data WD is logic "0". On the contrary, if the memory cell of the memory apparatus stores data with logic "0" after performing the erasing operation, the logic level of the bit of the write data WD is logic "1".

Figure 2:
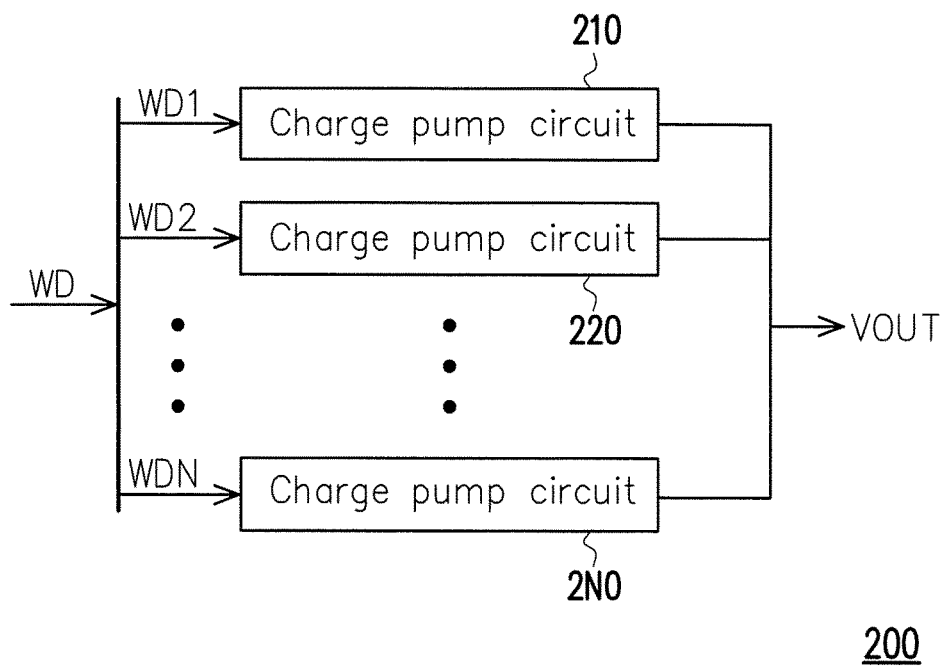
FIG. 2 illustrates a schematic diagram of a power supply for data programming operation according another embodiment of present disclosure.

Referring to FIG. 2, which illustrates a schematic diagram of a power supply for data programming operation according another embodiment of present disclosure. The power supply 200 includes charge pump circuits 210-2N0. The power supply 200 provides an output voltage VOUT for a data programming operation according to write data WD. Furthermore, the write data WD has N bits WD1-WDN. The N bits WD1-WDN are respectively transported to the charge pump circuits 210-2N0. The charge pump circuits 210-2N0 respectively receive the N bits WD1-WDN and are respectively enabled or disabled according to the N bits WD1-WDN. In detail, each of the N bits WD1-WDN is used to be an enable signal of each of the charge pump circuits 210-2N0. For example, the charge pump circuits 210 receives the bit WD1 of the write data WD. If the bit WD1 of the write data WD is a programmed bit, the charge pump circuits 210 is enabled to operate a charge pumping operation to generate the output voltage VOUT. On the contrary, if the bit WD1 of the write data WD is not a programmed bit, the charge pump circuits 210 is disabled.

In can be seen here, the number of programmed bits of the write data WD is direct proportion to the number of the enabled charge pump circuits. If the number of programmed bits gets higher, the output voltage VOUT can have a larger driving capability. On the contrary, if the number of programmed bits gets lower, the output voltage VOUT can have a lower driving capability, and power consumption of the power supply 200 can be reduced.

As a person skilled in the art knows, a charge pump circuit generates a pumped up voltage by pumping up a base voltage according to a clock signal. That is, the charge pump circuit can be enabled by receiving the clock signal and the base voltage, and the charge pump circuit can be disabled by stopping to receive the clock signal.

Figure 3:
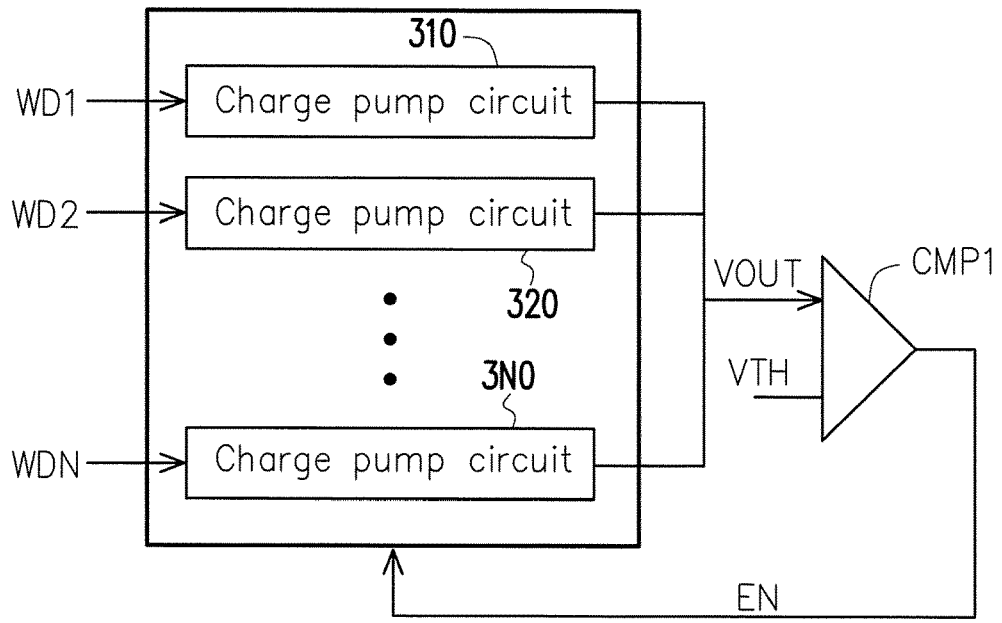
FIG. 3 illustrates a schematic diagram of a power supply according to another embodiment of present disclosure.

Referring to FIG. 3, which illustrates a schematic diagram of a power supply according to another embodiment of present disclosure. The power supply 300 includes charge pump circuits 310-3N0 and a comparator CMP1. The charge pump circuits 310-3N0 respectively receive a plurality of bits WD1-WDN and commonly generate an output voltage VOUT. The output voltage VOUT is provided for data programming operation of a memory apparatus (i.e., a flash memory). The comparator CMP1 is coupled to the charge pump circuits 310-3N0, and receives the output voltage VOUT and a reference voltage VTH. The comparator CMP1 compares the output voltage VOUT with the reference voltage VTH, and generates an enable signal EN according to the comparison result.

When the output voltage VOUT is smaller than the reference voltage VTH, the enable signal EN is provided to the charge pump circuits 310-3N0, and each of the charge pump circuits 310-3N0 is enabled or disabled according to corresponding bit WD1-WDN of the write data. On the contrary, when the output voltage VOUT is not smaller than the reference voltage VTH, the enable signal EN is provided to the charge pump circuits 310-3N0, and all of the charge pump circuits 310-3N0 are disabled.

Figure 4:
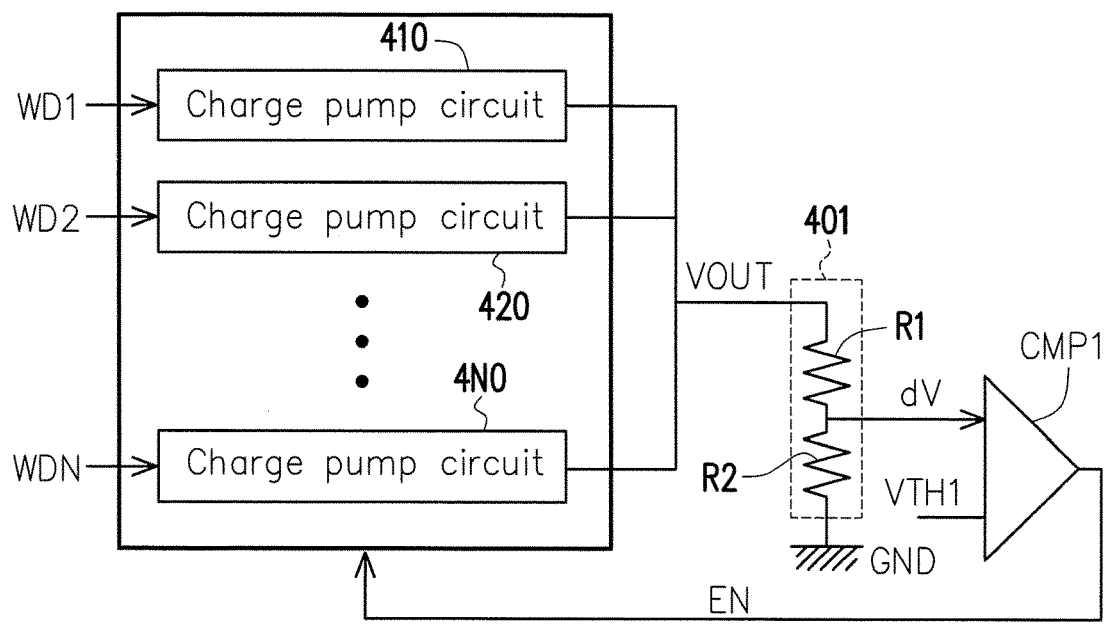
FIG. 4 illustrates a schematic diagram of a power supply according to another embodiment of present disclosure.

Referring to FIG. 4, which illustrates a schematic diagram of a power supply according to another embodiment of present disclosure. The power supply 400 includes charge pump circuits 410-4N0, a voltage divider 401 and a comparator CMP1. Different from the power supply 300, in the power supply 400, the voltage divider 401 is coupled between the charge pump circuits 410-4N0 and the comparator CMP1. The voltage divider 401 divides the output voltage VOUT to generate a divided voltage dV. The divided voltage dV is received by the comparator CMP1, and the comparator CMP1 compares the divided voltage dV with a reference voltage VTH1 to generate the enable signal EN. When the divided voltage dV is not smaller than the reference voltage VTH1, the enable signal EN is used to disable all of the charge pump circuits 410-4N0.

In this embodiment, the voltage divider 401 includes a resistor R1 and a resistor R2. The resistors R1 and R2 are coupled in series between the charge pump circuits 410-4N0 and a reference ground GND. In FIG. 4, the resistor R1 receives the output voltage by a first end, and is coupled to the resistor R2 by a second end. The resistor R2 is coupled between the second end of the resistor R1 and the reference ground GND. The second end of the resistor R1 provides the divided voltage dV.

Figure 5:
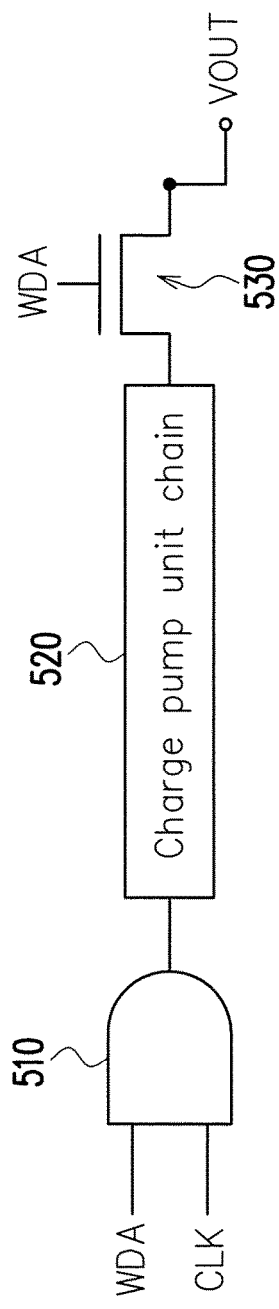
FIG. 5 illustrates a schematic diagram of a charge pump circuit according to an embodiment of present disclosure.

Referring to FIG. 5, which illustrates a schematic diagram of a charge pump circuit according to an embodiment of present disclosure. The charge pump circuit 500 includes a clock gating circuit 510, a charge pump unit chain 520 and a switch 530. The clock gating circuit 510 receives one bit WDA of a write data for programming and a clock signal CLK. The clock gating circuit 510 can decide whether pass the clock signal CLK to the charge pump unit chain 520 or not according to the bit WDA of a write data. The clock gating circuit 510 may be a logic gate (i.e., AND gate). If the bit WDA of the write data is a programmed bit, the clock gating circuit 510 passes the clock signal CLK to the charge pump unit chain 520 for charge pumping operation to generate the output voltage VOUT. If the bit WDA of the write data is not the programmed bit, the clock gating circuit 510 gates off the clock signal CLK, and the charge pump unit chain 520 doesn't perform the charge pump operation.

The charge pump unit chain 520 includes a plurality of charge pump units coupled in series. Detail structure of the charge pump unit chain 520 can be discussed in the embodiment of FIG. 6.

Please be noted here, the charge pump circuit 500 can further includes the switch 530, and the switch 520 can be disposed between an output end of the charge pump unit chain 520 and the output end for providing the out voltage VOUT. The switch 520 is controlled by the bit WDA of the write data. When the bit WDA of the write data is not the programmed bit, the switch 530 may be cut-off, and when the bit WDA of the write data is the programmed bit, the switch 530 may be turned on.

Figure 6:
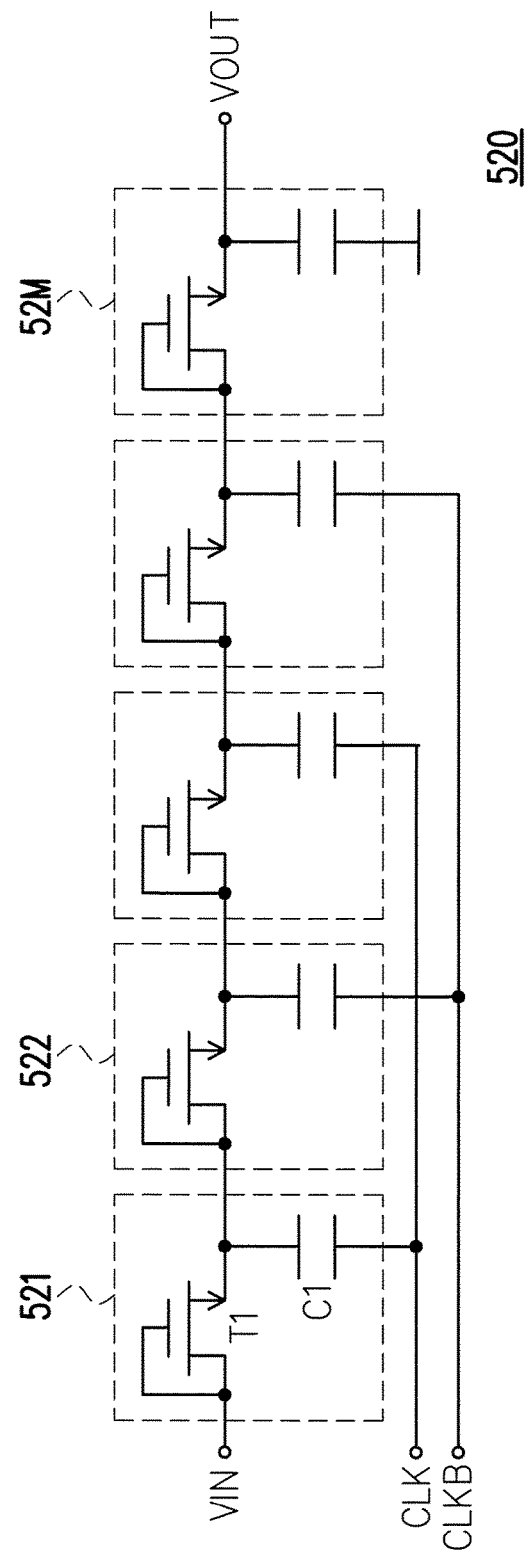
FIG. 6 illustrates a circuit diagram of the charge pump unit chain according to an embodiment of present disclosure.

Referring to FIG. 6, which illustrates a circuit diagram of the charge pump unit chain according to an embodiment of present disclosure. The charge pump unit chain 520 includes a plurality of charge pump units 521-52M coupled in series. The first stage charge pump unit 521 receives a base voltage VIN, and the charge pump units 521-52M receive the clock signal CLK and an inverted clock signal CLKB and pump up the base voltage VIN stage by stage to generate the output voltage VOUT according to the clock signal CLK. If the clock signal CLK is gated off by the clock gating circuit 510, the charge pump circuit 500 is disabled.

Take the charge pump unit 521 as an example. The charge pump unit 521 includes a transistor T1 and a capacitor C1. The transistor T1 receives the base voltage VIN and is connected to a diode connection. The transistor T1 is further coupled to the capacitor C1, and another end of the capacitor C1 receives the clock signal CLK. In this embodiment, the odd stage charge pump unit receives the clock signal CLK, and the even stage charge pump unit receives the inverted clock signal CLKB. The inverted clock signal CLKB can be generated by inverting the clock signal CLK.

Of course, the charge pump unit chain 520 is only an example, and any charge pump circuit known by a person skilled in the art can be implemented in the power supply of present disclosure. The embodiments in FIG. 5 and FIG. 6 are not used to limit claim scope of present disclosure.

Figure 7:
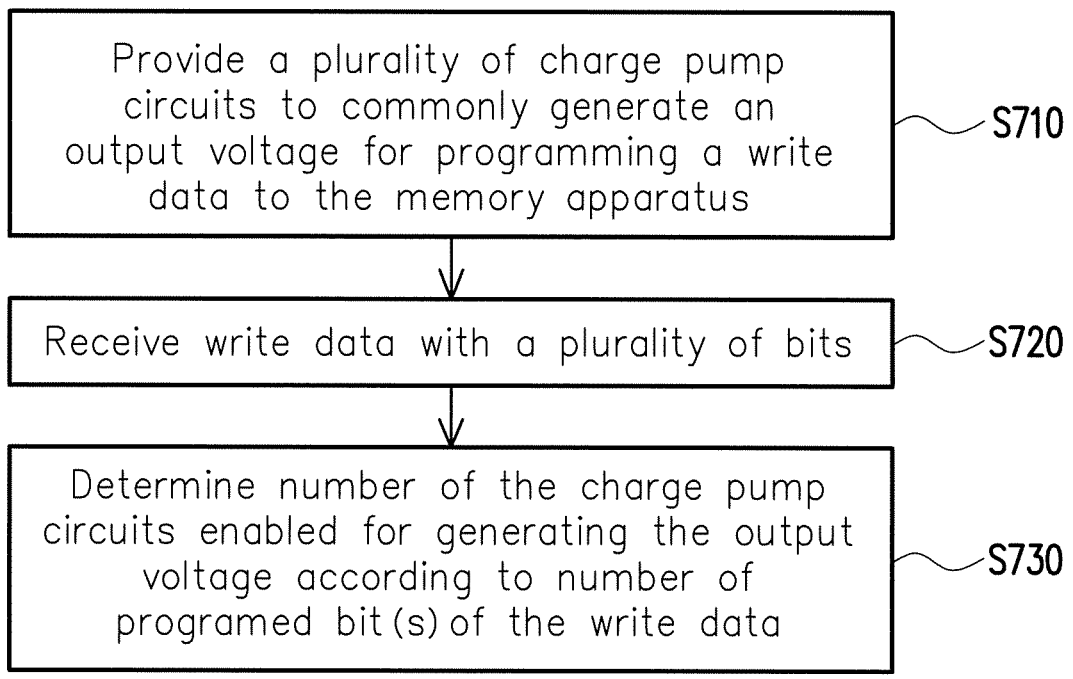
FIG. 7 illustrates a flow chart of power supplying method according to an embodiment of present disclosure.

Referring to FIG. 7, which illustrates a flow chart of power supplying method according to an embodiment of present disclosure. A step S710 provides a plurality of charge pump circuits to commonly generate an output voltage for programming a write data to the memory apparatus, a step S720 receives write data with a plurality of bits, and a step S730 determines number of the charge pump circuits enabled for generating the output voltage according to number of programmed bit(s) of the write data.

The detail operation about the steps S710-S730 have been described in the embodiments mentioned above, and no more repeated description here.

In summary, the present disclosure determined the number of enabled charge pump circuits according to the number of the programmed bits of the write data. That is, a driving capability of the output voltage for programming operation can be adjusted according the number of the programmed bits. That is, power efficiency can be optimized for the programming operation in a non-volatile memory.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A power supply for data programming operation, adapted for a memory apparatus, comprising:
   a plurality of charge pump circuits, commonly generating an output voltage for programming a write data to the memory apparatus, wherein each of the charge pump circuits comprises:
      a plurality of charge pump units coupled in series; and
      a switch, coupled between a last stage charge pump unit and output ends of the charge pump circuits, and controlled by a corresponding bit of the write data to be turned-on or cut-off, wherein the output voltage is output to the output ends of the charge pump circuits when the switch is turned on, and the output voltage is not output to the output ends of the charge pump circuits when the switch is cut off,
   wherein number of the charge pump circuits enabled for generating the output voltage is determined according to number of programmed bit(s) of the write data.

2. The power supply for data programming operation as claimed in claim 1, wherein number of the charge pump circuits equals number of the bits of the write data, and the number of the charge pump circuits enabled for generating the output voltage equals the number of the programmed bit(s) of the write data.

3. The power supply for data programming operation as claimed in claim 2, wherein the charge pump circuits respectively receive the bits of the write data, and each of the charge pump circuits is enabled or disabled according to corresponding received bit of the write data.

4. The power supply for data programming operation as claimed in claim 3, wherein each of the charge pump circuits further comprises:
   a clock gating circuit, receiving the corresponding received bit of the write data and a clock signal, determining whether to pass the clock signal to each of the charge pump circuits or not according to the corresponding received bit of the write data.

5. The power supply for data programming operation as claimed in claim 4, wherein each of the plurality of charge pump units receives an output signal of the clock gating circuit.

6. The power supply for data programming operation as claimed in claim 1, further comprising:
   a comparator, receiving the output voltage, and comparing the output voltage with a reference voltage to generate an enable signal,
   wherein the enable signal is used to disable all of the charge pump circuits if the output voltage is not smaller than the reference voltage.

7. The power supply for data programming operation as claimed in claim 1, further comprising:
   a voltage divider, coupled to the charge pump circuits, receiving and dividing the output voltage and generating a divided voltage; and
   a comparator, receiving the divided voltage, and comparing the divided voltage with a reference voltage to generate an enable signal,
   wherein the enable signal is used to disable all of the charge pump circuits if the divided voltage is not smaller than the reference voltage.

8. The power supply for data programming operation as claimed in claim 7, wherein the voltage divider comprises:
   a first resistor, coupled between the output ends of the charge pump circuits and a first end; and
   a second resistor, coupled between the first end and a reference ground,
   wherein the first end provides the divided voltage to the comparator.

9. A power supplying method for data programming operation, adapted for a memory apparatus, comprising:
   providing a plurality of charge pump circuits to commonly generate an output voltage for programming a write data to the memory apparatus, wherein each of the charge pump circuits comprises a plurality of charge pump units coupled in series and a switch coupled between a last stage charge pump unit and output ends of the charge pump circuits;
   receiving write data with a plurality of bits; and
   determining number of the charge pump circuits enabled for generating the output voltage according to number of programmed bit(s) of the write data, comprising:
      controlling the switch of each of the charge pump circuits to turn-on or cut-off an output path of each of the charge pump circuits according to each of the corresponding received bits of the write data, wherein the output voltage is output to the output ends of the charge pump circuits when the switch is turned on, and the output voltage is not output to the output ends of the charge pump circuits when the switch is cut off.

10. The power supplying method as claimed in claim 9, wherein number of the charge pump circuits equals number of the bits of the write data, and the number of the charge pump circuits enabled for generating the output voltage equals the number of the programmed bit(s) of the write data.

11. The power supplying method as claimed in claim 9, wherein step of determining the number of the charge pump circuits enabled for generating the output voltage according to the number of programmed bit(s) of the write data comprises:

providing the charge pump circuits respectively receive the bits of the write data; and disabling or enabling each of the charge pump circuits according to each of corresponding received bits of the write data.

12. The power supplying method as claimed in claim 11, wherein step of disabling or enabling each of the charge pump circuits according to each of the corresponding received bits of the write data comprises:

providing a clock gating circuit for determining whether to pass a clock signal to each of the charge pump circuits or not according to the corresponding received bit of the write data.

13. The power supplying method as claimed in claim 10, further comprising:

comparing the output voltage with a reference voltage to generate an enable signal; and disabling all of the charge pump circuits if the output voltage is not smaller than the reference voltage.

14. The power supplying method as claimed in claim 10, further comprising:

dividing the output voltage to generate a divided voltage;

comparing the divided voltage with a reference voltage to generate an enable signal; and disabling all of the charge pump circuits if the output voltage is not smaller than the reference voltage.

\* \* \* \* \*